(12) United States Patent
Tiilikainen

(10) Patent No.: US 6,181,194 B1
(45) Date of Patent: *Jan. 30, 2001

(54) CALIBRATABLE FIELD EFFECT TRANSISTORS

(75) Inventor: Mika Tiilikainen, Helsinki (FI)

(73) Assignee: Nokia Mobile Phones Limited, Espoo (FI)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/133,240

(22) Filed: Aug. 13, 1998

(30) Foreign Application Priority Data

Sep. 1, 1997 (FI) .......................................... 973574

(51) Int. Cl.$^7$ ....................................................... G05F 1/10
(52) U.S. Cl. ........................................... 327/538; 327/543
(58) Field of Search ..................... 327/538, 540, 327/541, 543; 323/312, 315

(56) References Cited

U.S. PATENT DOCUMENTS

| | | | |
|---|---|---|---|
| 4,540,952 | * 9/1985 | Williams | 330/279 |
| 4,871,251 | * 10/1989 | Preikschat et al. | 356/336 |
| 5,289,059 | 2/1994 | Pikkarainen | 307/520 |
| 5,365,119 | 11/1994 | Kivari | 327/115 |
| 5,387,874 | 2/1995 | Rapeli | 327/337 |
| 5,390,223 | 2/1995 | Lindholm | 377/49 |
| 5,416,435 | 5/1995 | Jokinen et al. | 327/113 |
| 5,430,670 | * 7/1995 | Rosenthal | 365/45 |
| 5,497,116 | 3/1996 | Rapeli | 327/337 |
| 5,557,234 | * 9/1996 | Collins | 327/563 |
| 5,581,776 | 12/1996 | Hagqvist et al. | 395/590 |
| 5,831,303 | * 11/1998 | Rapeli | 257/316 |

FOREIGN PATENT DOCUMENTS

| | | |
|---|---|---|
| 08285682 | 11/1996 | (JP) . |
| 08288762 | 11/1996 | (JP) . |
| 09034573 | 2/1997 | (JP) . |

OTHER PUBLICATIONS

Patent Abstracts of Japan, JP 1–19809.

* cited by examiner

Primary Examiner—Tuan T. Lam
(74) Attorney, Agent, or Firm—Perman & Green, LLP

(57) ABSTRACT

A method of calibrating a field effect transistor having a source (3), a drain (4), a resistive gate (2), and a calibration DC current source (7) and a calibration DC current sink (7) coupled to respective spaced apart regions of the transistor gate (2). In use a substantially DC calibration current is passed through the gate (2) between said spaced apart regions to trim the effective width of the transistor channel.

10 Claims, 4 Drawing Sheets

CALIBRATABLE FIELD EFFECT TRANSISTORS

FIELD OF THE INVENTION

The present invention relates to field effect transistors and is applicable in particular, though not necessarily, to field effect transistors for use in current mirrors and other current sources.

BACKGROUND OF THE INVENTION

In many analogue circuit arrangements there is a requirement for accurate and constant reference voltages and currents. In the case of reference currents, these are often generated using a reference voltage source and a resistor. In integrated analogue circuits, chip space is at a premium and it is common to integrate only one, or a small number of such source/resistor combinations into a chip and to generate other reference currents from the basic reference current(s) using current mirrors. Current mirrors have a relatively simple construction and do not occupy a large chip area. A typical current mirror, comprising a pair of matched MOS-FET transistors (a reference transistor T and a mirroring transistor M), is illustrated in FIG. 1 where $t_n$ is the reference current and Iout is the mirrored output current. The current mirror may be extended by adding one or more additional current mirroring transistors in parallel.

One application for current mirrors is in digital to analogue (D/A) converters, where inaccuracies in the reference currents and voltages tend to dominate as a source of conversion errors over factors such as switch resistances and unmatched loads. A simple 4-bit D/A converter is shown in FIG. 2, and comprises a reference MOSFET transistor T and four mirroring MOSFET transistors $M_0$ to $M_3$ arranged in a current mirroring configuration. Transistors T and $M_0$ have a channel width to length ratio of W/L whilst transistors $M_1$, $M_2$, and $M_3$ have ratios of 2W/L, 4W/L, and 8W/L respectively. A switch ($S_0$ to $S_3$) is arranged in series with the drain of each MOSFET ($M_0$ to $M_3$), the switches being controlled by respective bits ($a_0$ to $a_3$) of the digital (binary) signal to be converted. $a_0$ corresponds to the least significant bit (LSB) of the signal whilst $a_3$ corresponds to the most significant bit (MSB). The switches ($S_0$ to $S_3$) are coupled together at one end and draw an output current $I_{out}$ depending upon the activation state of the switches.

Current mirrors such as that employed in the D/A converter of FIG. 2 copy or scale reference currents with varying degrees of accuracy depending upon the precise construction of the mirrors. In practice, errors will arise because the transistors of the current mirror are not identical (or are not scaled identically). The extent of this mismatch may be minimised by using the common-centroid method to determine the layout of the transistors. For example, for the 4-bit converter shown in FIG. 2, transistors T and $M_0$ are provided by respective single transistor elements, whilst transistors $M_1$, $M_2$, and $M_3$ are provided respectively by two, four, and eight parallel connected transistor elements (each with a channel width to length ratio of W/L). These elements are arranged in a geometric pattern as illustrated in FIG. 3 where transistor elements are shown by element number (and T represents the diode connected reference transistor). However, particularly for high bit D/A converters (e.g. 12 or 14 bits), the common centroid method does not ensure high accuracy for conversion of the MSBs. This may be due to the large separation between transistor elements making up the transistors corresponding to these bits. Whilst techniques such as laser trimming can be used to physically adjust the dimensions and properties of certain circuit elements, these are generally time consuming and expensive to implement.

There are many other applications where inaccuracies in the properties of field effect transistors can be a source of serious error. One example is the so called 'pipeline' analogue to digital (A/D) converters in which field effect transistors are incorporated into subtractor, multiplier, and comparator circuits. The precision of such a converter is critically dependent upon the 30 operating precision of the transistors in these circuits.

In high quality applications D/A and A/D converters must be capable of operating at the Nyquist frequency. In the case of mobile communication devices, at present and near future data processing rates, use of converters in the intermediate-frequency (IF) band means an operating frequency of 10 MHz or greater. Whilst converters based upon the architecture of FIG. 2 can operate at such high frequencies, the conversion accuracy is often unsatisfactory for high bit converters. On the other hand, converters based on alternative architectures, such as the sigma-delta (or oversampling) converter, offer high accuracy and high bit conversion but suffer from slow speed (operating at only a few MHz). With these or other converters, the large chip area occupied by the converter as well as high power consumption can also become a problem where large scale integration is desired.

SUMMARY OF THE INVENTION

It is an object of the present invention to provide for the calibration of field effect transistors using electrical adjustment.

According to a first aspect of the present invention there is provided an electrical circuit comprising:

a field effect transistor having a source, a drain, and a gate; and a calibration DC current source and a calibration DC current sink coupled to respective spaced apart regions of the transistor gate, whereby in use a substantially DC calibration current may be passed through the gate between said spaced apart regions.

The present invention provides for trimming of the 'effective' width of the channel of a field effect transistor using a DC calibration current. The calibration current affects the properties of the channel to a small extent, relative to the size of the calibration current, and it is therefore possible to adjust, or trim, the channel to a marginal extent using relatively large variations in the calibration current.

Preferably, the transistor gate is resistive, for example resistive polysilicon. More preferably, the gate material is unsilicided polysilicon. Typically, the resistance of the gate is greater than 10 ohm/□(ohms/squre). Preferably, the calibration current source and sink have high output impedances, for example greater than 200 K ohms.

Preferably, the calibration current source and sink are arranged to source and sink substantially identical DC currents. In this way, interference of the calibration current with the active signal current of the transistor is prevented. More preferably, the calibration source and sink are provided by a digital to analogue converter coupled to respective gate regions via a current mirror.

The field effect transistor may be composed of a plurality of transistor elements coupled together, with a common gate or a set of serially connected gates. In this case, said two spaced apart regions may be provided on the gate, or gate region, of one of the transistor elements. Alternatively, a first of the spaced apart regions may be provided on a first of the gates or gate regions with the other spaced apart region being provided on a second of the gates or gate regions. Said first and second gate regions may be coupled in series about a resistive element. Additional gate regions and respective resistive elements may be coupled in series between the first and second gate regions. In yet another alternative, independent calibration DC current sources and sinks may be coupled to respective spaced apart regions of two or more gates or gate regions, whereby the corresponding transistor elements may be independently calibrated.

According to a second aspect of the present invention there is provided a current mirror comprising:

a reference field effect transistor and at least one mirroring field effect transistor, at least one of the transistors being arranged in an electrical circuit according to the above first aspect of the present invention; and a constant current source coupled to the reference transistor, wherein in use the reference current causes a mirroring current to be generated in the or each mirroring transistor.

With the above second aspect of the invention, the magnitude of the mirroring current(s) may be adjusted by adjusting the calibration source and sink currents.

Preferably, the transistor forming part of said electrical circuit is a mirroring transistor. Alternatively, the reference transistor may form part of said electrical circuit.

Preferably, the field effect transistors are metal oxide semiconductor FETs (MOSFETs). Alternatively however, other transistors such as metal field effect transistors (MESFETs) may be used.

According to a third aspect of the present invention there is provided a D/A converter comprising a current mirror according to the above second aspect of the present invention, wherein each mirroring transistor corresponds to one conversion bit.

Preferably, the D/A converter is arranged to operate in the current mode.

Preferably, the geometry of the converter is determined according to the common-centroid method and the DC calibration current source and sink are coupled to at least the transistor corresponding to the most significant conversion bit.

According to a fourth aspect of the present invention there is provided a method of operating a field effect transistor having a source, a drain, and a gate, the method comprising inputting a DC calibration current into a first region of the transistor gate and extracting a DC calibration current from a second region of the gate, said first and second regions being spaced apart from one another, the calibration currents having been determined to compensate the transistor for operating errors.

According to a fifth aspect of the present invention there is provided a method of calibrating a field effect transistor having a source, a drain, and a gate, and forming part of an electrical circuit according to the above first aspect of the present invention, the method comprising the steps of:

biasing the transistor into the ON state;

monitoring the source/drain current of the transistor; and adjusting the DC calibration currents applied to said calibration source and drain to provide a desired source/drain current.

The calibration current(s) determined during this process may be stored in a memory. When the device is in use, the stored current value(s) may be read from the memory and corresponding current(s) applied to the transistor According to a sixth aspect of the present invention there is provided a method of operating a current mirror which comprises a reference field effect transistor and at least one mirroring field effect transistor, each transistor having a source, a drain, and a gate, the method comprising the steps of:

applying a constant current to the source or drain of the reference transistor to generate a mirror current in the or each mirroring transistor;

inputting a DC calibration current into a first region of the gate of at least one of the transistors and extracting a DC calibration current from a second region of the gate of the same transistor(s), said first and second regions being spaced apart from one another; and adjusting the input and extracted calibration currents to trim the mirror current(s).

Preferably, the input and extracted DC calibration currents are substantially identical in magnitude.

Preferably, the method comprises inputting a DC calibration current into, and extracting a DC calibration current from, the gate of the or at least one mirroring transistor. Where the mirror comprises two or more mirroring transistors having a common gate, a single calibration current may be input to and extracted from the common gate.

BRIEF DESCRIPTION OF THE DRAWINGS

For a better understanding of the present invention and in order to show how the same may be carried into effect reference will now be made, by way of example, to the accompanying drawings, in which.

DETAILED DESCRIPTION

Figure 1:
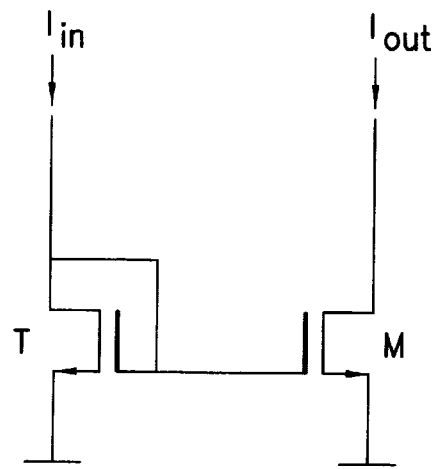
FIG. 1 illustrates a simple current mirror of known design.
Figure 2:
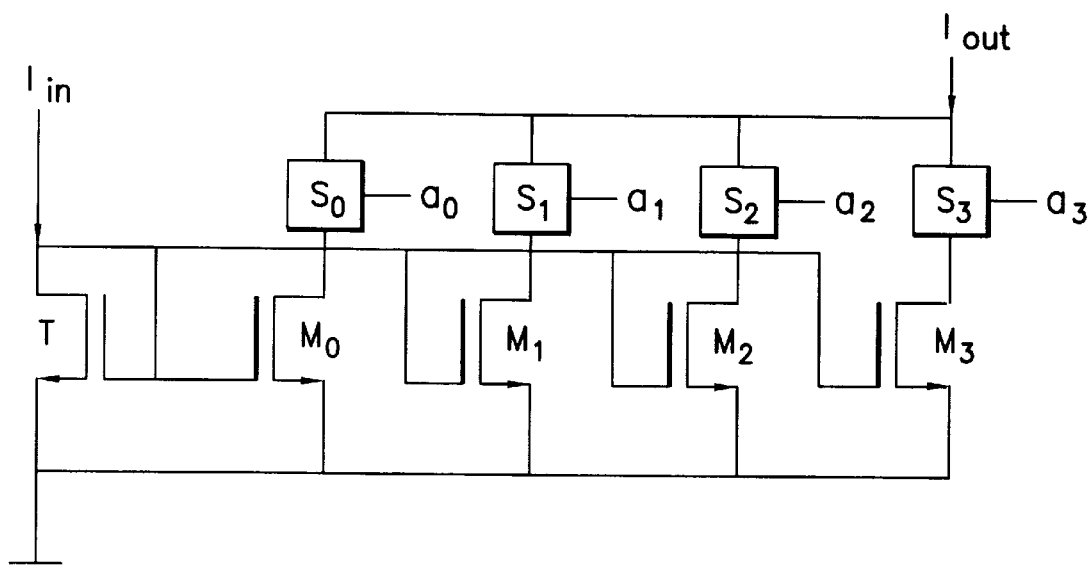
FIG. 2 illustrates a simple 4-bit digital to analogue converter of known design.
Figures 3, 4:
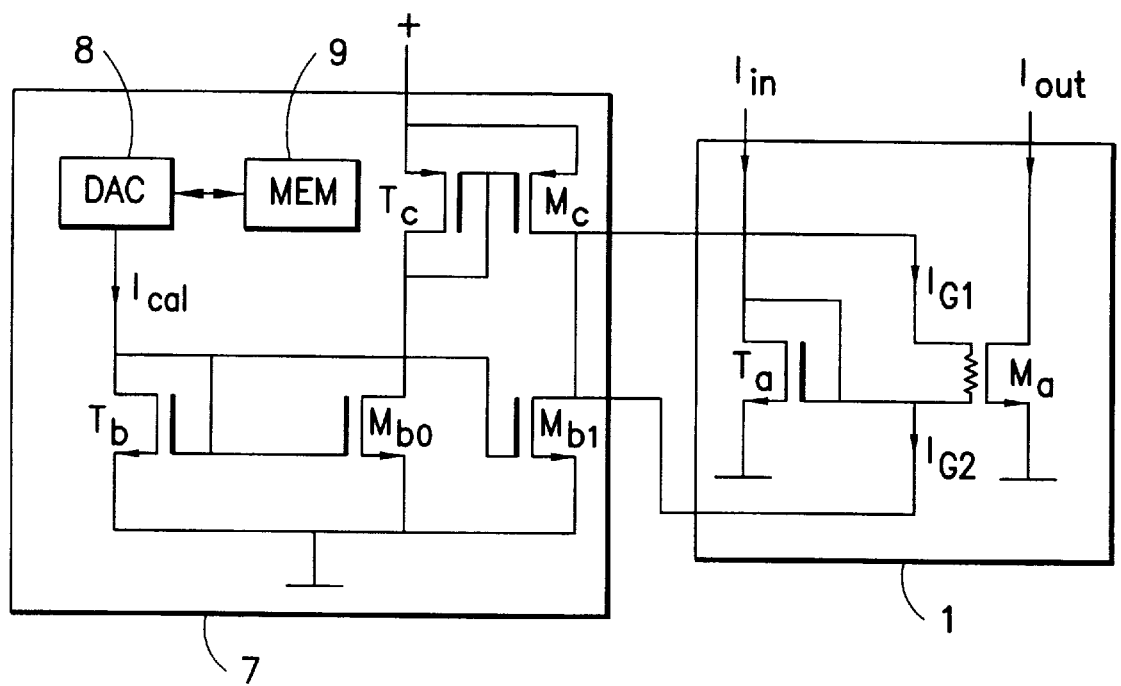
FIG. 3 illustrates the geometrical chip layout for the digital to analogue converter of FIG. 2 according to the common-centroid method.
FIG. 4 illustrates a current mirror incorporating a calibration system.
Figure 5:
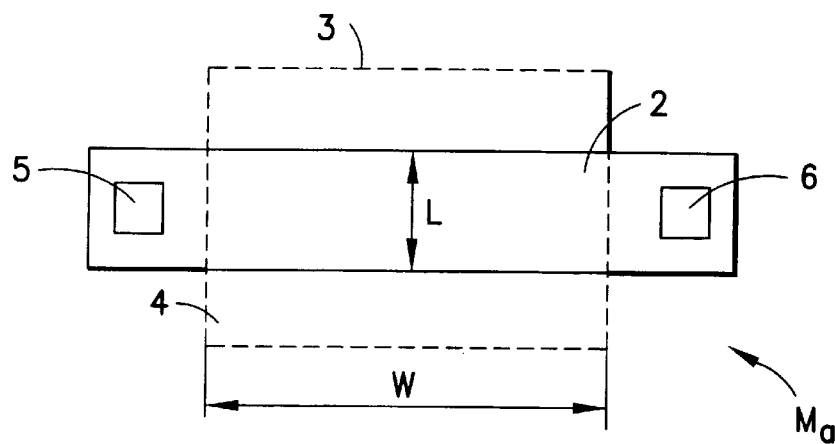
FIG. 5 illustrates in more detail gate connections to a mirroring transistor of the current mirror of FIG. 4.

The structure of a simple current mirror has been described above with reference to FIG. 1, as has that of a simple D/A converter which might make use of such a current mirror (FIGS. 2 and 3). FIG. 4 shows an arrangement for compensating the current mirror of FIG. 1 (indicated generally by the reference numeral 1) where the mirroring transistor $M_a$ has a modified gate structure as shown in FIG. 5.

More particularly, the mirroring transistor $M_a$ is a MOSFET transistor in which a gate 2 is provided on top of the transistor channel extending between the source and drain regions 3,4. The width W of the gate is greater than its length L. A pair of gate connections 5,6 are provided at opposed end regions of the gate 2 for the purpose of passing a DC current through the gate 2 as will be described hereinbelow.

The gate 2 is formed of resistive, unsilicided polysilicon which typically has a resistance of several tens of ohms/L and which is deposited over the gate oxide. In order to ensure that the polysilicon gate remains resistive (and does not become silicided by the subsequent deposition of metal silicides), the gate 2 is protected by a siprot-mask (silicide protection mask) available, for example, from SGS-Thomson (France) under the Trade Mark HCMOS5, which protects the gate from post-metalisation. If allowed to happen, post-metalisation would reduce the resistance of the gate to an unacceptably low level (i.e. less than 1 ohm/☐). These techniques are commonly used in the fabrication of analogue integrated circuits.

The circuit of FIG. 4 comprises a calibration circuit, indicated generally by the reference numeral 7, having a first current mirror ($T_b, M_{b0}, M_{b1}$) with a pair of current mirroring transistors $M_{b0}, M_{b1}$. A first of these mirroring transistors $M_{b1}$ generates a DC calibration sink current ($I_{G2}$) from a calibration input current $I_{cal}$. The second mirroring transistor $M_{b0}$ generates a DC current which is used by a second current mirror ($T_c, M_c$) to generate a DC calibration source current ($I_{G1}$), where $I_{G1} = I_{G2} = I_G$. The calibration current ($I_{cal}$) is generated by a D/A converter 8 such as that illustrated in FIG. 2. The calibration circuit presents a high output impedance current source and sink to the MOSFET gate 2.

The gate calibration current $I_G$ through the resistive gate 2 of the mirroring transistor $M_a$ gives rise to a voltage gradient across the width W of the FET channel. This gradient is superimposed on the normal gate bias voltage which results from the input current $I_{in}$, and effectively modifies the channel width W. Changes in the gate calibration current $I_G$ will therefore change the output current $I_{out}$. However, the effect of the gate calibration current on the channel width is relatively small, so that relatively coarse adjustment of the gate current (i.e. 50 $\mu$A) will result in a fine adjustment of the output current $I_{out}$. It will be apparent that in order to produce satisfactory calibration, the D/A converter 8 does not need to be of particularly high precision and a three or four bit converter may be sufficient. The application of a gate calibration current to the mirroring transistor $M_a$ enables the accurate calibration or trimming of a current mirror to generate a precisely defined reference current.

The digital calibration current value is read by the D/A converter 8 from a memory 9. Typically, this value is determined during a factory set-up stage where the calibration current $I_{cal}$ is adjusted until the correct output current $I_{out}$ is achieved. The corresponding digital value is then written to the memory 9.

Figure 6:
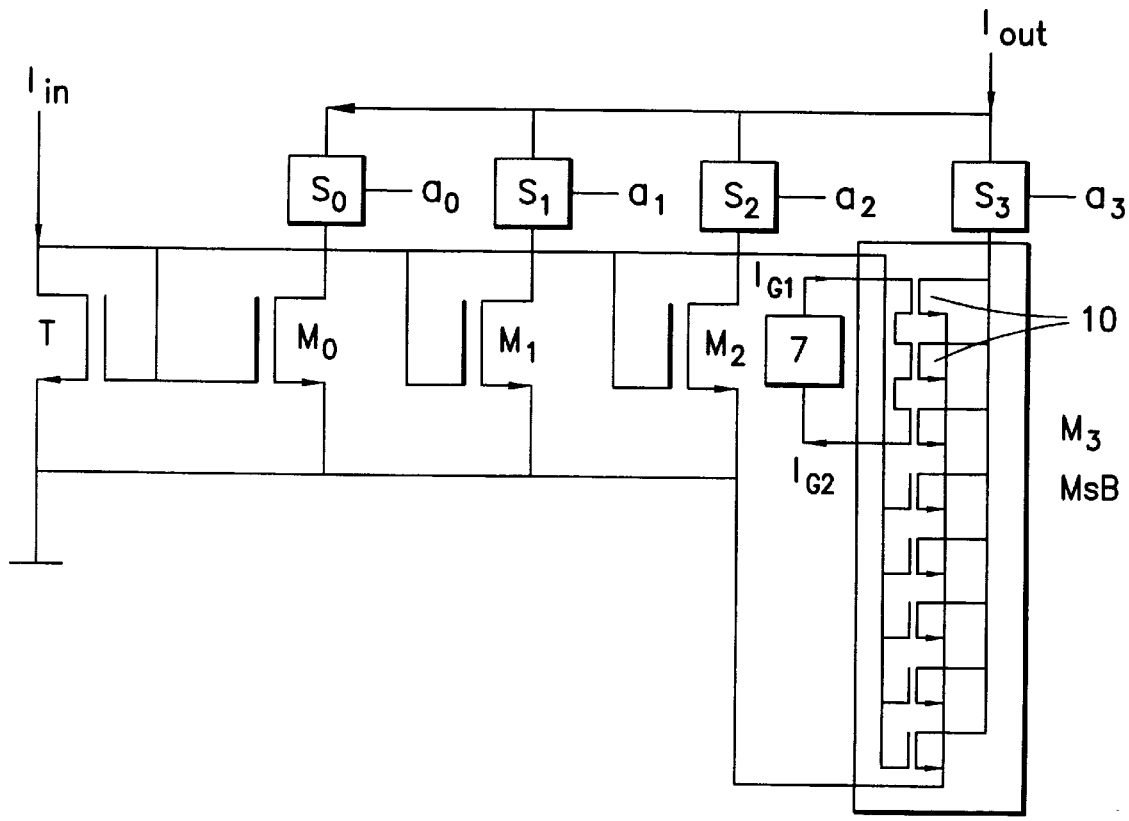
FIG. 6 illustrates the calibration system of FIG. 4 applied to a digital to analogue converter of the type shown in FIG. 2.

As has been discussed above with reference to FIG. 2, a D/A converter may be constructed using a current mirror having a plurality of mirroring transistors. Each mirroring transistor may in turn be provided by a set of parallel connected transistor elements. This is illustrated in more detail in FIG. 6, where only mirroring transistor $M_3$, corresponding to the MSB of the D/A converter, is shown 'decomposed' into its eight individual transistor elements 10. In order to allow $M_3$ to be calibrated, a calibration circuit 7 such as that shown in FIG. 4 may be coupled across the gate region of one of the transistor elements 10. However, as is shown in FIG. 6, a greater level of adjustment is possible by connecting the gate regions of a number of the transistor elements (in this case three) in series and driving the calibration current $I_G$ through all three elements. If the aspect ratio (W/L) of the individual transistor elements is for example 20$\mu$/10$\mu$, and the unsilicided polysilicon has a resistivity of 100 ohm/☐, then the resistance of the unsilicided gate is 200 ohms and the total resistance of the three serially connected gate regions is 600 ohms. This results in a 30 mV voltage drop across the gate with a 50 uA calibration current. This approach may be extended to four, five, or even to all eight gate elements 10 to increase the calibration range still further.

Figure 7:
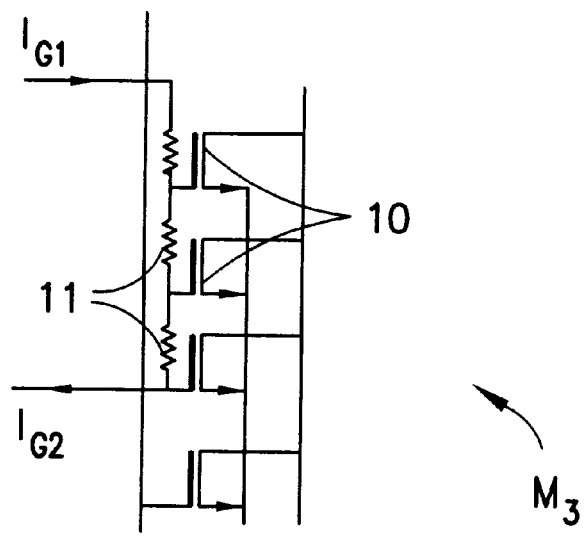
FIG. 7 illustrates a modification to the calibration system of FIG. 6.

FIG. 7 shows the top four transistor elements 10 of the mirroring transistor $M_3$ of FIG. 6, modified to allow the use of only low resistance gates. As has been described above, where the resistance of the MOSFET gate is low, only a relatively small voltage drop will occur across the gate. However, by connecting the gate regions through which the compensating current $I_G$ is to flow (i.e. those of the top three transistor elements) with resistances 11, the compensating current will give rise to a fixed bias voltage on each of these gate regions. The bias voltage will depend upon the magnitude of the compensating current $I_G$. Thus, the effective channel widths of the resistance coupled transistor elements may be modified by changing the compensating current $I_G$. In practice, it may be desirable to implement the coupling resistances of FIG. 7 with MOSFETs operating in the linear region as these occupy a relatively small chip area compared, for example, to resistors.

The arrangement of FIG. 6 provides for decreasing the reference voltage provided by the reference transistor to the mirror transistor elements. In order to provide for both positive and negative calibration, it is necessary to modify the calibration circuit 7 to selectively provide a positive or a negative calibration current. Alternatively, the number of transistor elements may be chosen to ensure that the output current exceeds the required current so that compensation will always be in the negative direction or vice versa. In this way only a negative, or only a positive, calibration current is required.

The provision of calibration for the MSB of the D/A converter is particularly desirable because, when the common-centroid method is used to determine chip geometry, the transistor elements which make up the MSB transistor tend to lie on the periphery. However, calibration as described above may be applied to others of the transistors and to one or more transistor elements of those transistors.

Whilst the embodiments described above concern only the so-called 'simple' current mirror, the invention may be applied to compensate other types of current mirrors such as 'cascode' current mirrors.

Figure 8:
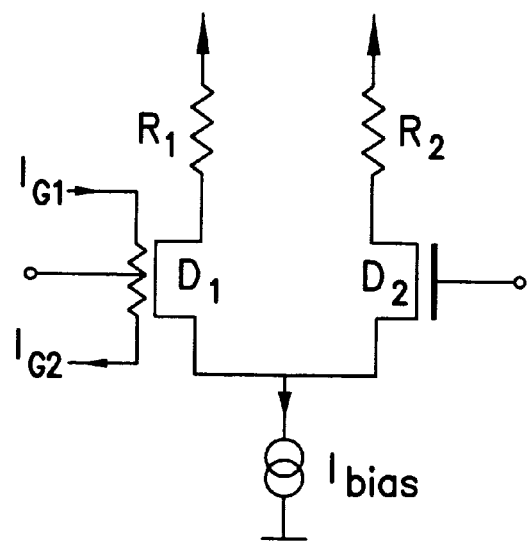
FIG. 8 illustrates the calibration circuit of FIG. 4 applied to a differential amplifier.

To illustrate yet another application of the present invention, FIG. 8 shows a simple differential amplifier comprising a pair of MOSFETs $D_1$ and $D_2$, a pair of resistances $R_1$, $R_2$, and a constant current source providing a bias current $I_{bias}$. FET $D_1$ is provided with a resistive gate and a pair of calibration current gate contacts, as has been described above (FIG. 5). A calibration current $I_{G1} = I_{G2}$ can be passed through the gate, via these contacts, to compensate the differential amplifier for any offset present.

It will be appreciated by the person of ordinary skill in the art that the present invention may be applied to calibrate any MOSFET which is used to generate an accurately defined current and is not restricted to use in current mirrors and/or digital to analogue converters. For example, the present invention may be applied to calibrate MOSFETs used in differential amplifiers and comparators. Calibration may be carried out during a one off factory set-up stage with the determined calibration current being stored in a digital memory. Alternatively, the compensation current may be determined, for example, each time a device employing the transistor is turned on or at regular intervals during the operation of the device. This may allow the transistor to be compensated for example for changes in temperature. It will also be appreciated that the D/A converter described above may be used to construct an A/D converter.

What is claimed is:

1. An electrical circuit comprising:
   a calibratable first field effect transistor (FET) having a source, a drain, and a gate; and
   a calibration DC current source and a calibration DC current sink, said calibration DC current source and said calibration DC current sink controlled by a digital-to-analog converter and a memory, coupled to respective spaced apart regions of the gate of the calibratable first FET, wherein a substantially DC calibration current is passed through the gate between said spaced apart regions.

2. A circuit according to claim 1, wherein the gate of the calibratable first FET has a sheet resistance of greater than 10 ohms per square.

3. A circuit according claim 1, wherein the calibratable first FET comprises unsilicided polysilicon.

4. A circuit according to claim 1, wherein the calibration DC current source and the calibration DC current sink are arranged to source and sink substantially identical DC currents.

5. A circuit according to claim 1, wherein at least one calibratable transistor element is coupled with the calibratable first FET, and said gate of the calibratable first FET comprises a gate common to the at least one calibratable transistor element.

6. A circuit according to claim 5, wherein element the at least one calibratable transistor elements comprising a gate region, and wherein said spaced apart regions are provided on said gate of the first calibratable FET and said gate region of the at least one calibratable element.

7. A circuit according to claim 6, wherein a first of the spaced apart regions is provided on a first of the gate region of the calibratable first FET with other spaced apart regions being provided on the at least one calibratable transistor element coupled with the calibratable first FET.

8. A circuit according to claim 7, wherein the said first spaced apart regions and the other spaced apart regions being provided on respective ones of the at least one calibratable transistor element coupled with the calibratable first FET, are coupled in series wherein the calibratable transistor element are biased at different operating points.

9. A method of calibrating a calibratable field effect transistor (FET) having a source, a drain, and a gate, and an adjustable calibrating current source/sink, said adjustable calibrating current source/sink controlled by a digital-to-analog converter with a memory, coupled to respective spaced apart regions of the calibratable FET, wherein the method comprising the steps of:
   biasing the calibratable FET to be calibrated into the ON state;
   arranging the memory of said digital to analog converter for controlling of the adjustable calibrating current source/sink in order to obtain a desired output current through the calibratable FET; and
   registering the contents of the memory of said digital to analog converter.

10. A method of calibrating a calibratable FET having a source, a drain, and a gate as in claim 9, further comprising inputting a DC calibration current into a first region of the spaced apart region of the calibratable FET gate and extracting a DC current from a second region of the spaced apart region of the calibratable FET gate, said first and second regions being spaced apart from one another.

* * * * *